United States Patent
Le Dantec

(10) Patent No.: US 6,625,762 B1
(45) Date of Patent: Sep. 23, 2003

(54) INTERLEAVING DEVICE AND METHOD FOR TURBOCODING AND TURBODECODING

(75) Inventor: Claude Le Dantec, Saint Hilaire des Landes (FR)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/513,468

(22) Filed: Feb. 25, 2000

(30) Foreign Application Priority Data

Mar. 5, 1999 (FR) .............................. 99 02789

(51) Int. Cl.⁷ .................. G06F 11/00; H03M 13/00
(52) U.S. Cl. ........................... 714/701; 714/786
(58) Field of Search ................ 714/701–702, 714/786, 755; 375/265

(56) References Cited

U.S. PATENT DOCUMENTS

| | | | |
|---|---|---|---|
| 4,547,887 A | 10/1985 | Mui | 375/1 |
| 5,446,747 A * | 8/1995 | Berrou | 714/788 |
| 5,483,541 A | 1/1996 | Linsky | 714/701 |
| 6,023,783 A * | 2/2000 | Divsalar et al. | 714/792 |
| 6,289,486 B1 * | 9/2001 | Lee et al. | 714/788 |
| 6,334,197 B1 * | 12/2001 | Eroz et al. | 714/701 |

FOREIGN PATENT DOCUMENTS

| | | |
|---|---|---|
| EP | 0 235 477 A1 | 9/1987 |
| EP | 0 928 071 A1 | 7/1999 |
| WO | WO 97 40582 A | 10/1997 |
| WO | WO 99 07076 A | 2/1999 |

OTHER PUBLICATIONS

Berrou et al., Near Shannon Limit Error–Correcting Coding and Decoding: Turbo–codes, 1993, IEEE, p. 1064–1070.*
Berrou et al., Near Optimum Error Correcting Coding and Decoding: Turbo–codes, Oct. 1996, IEEE, p. 1261–1271.*
(1) "Terminating the Trellis of Turbo–Codes in the Same State" by A.S. Barbulescu and S.S. Pietrobon, Electronics Letters, Jan. 5, 1995, vol. 31 No. 1.
(2) "Turbo–Block–Codes" by C. Berrou, S. Evano and G. Battail.

* cited by examiner

*Primary Examiner*—Albert Decady
*Assistant Examiner*—Shelly A Chase
(74) *Attorney, Agent, or Firm*—Fitzpatrick, Cella, Harper & Scinto

(57) ABSTRACT

The invention proposes interleaving binary symbols representing a physical quantity, used in a coding system with at least two recursive convolutional coders each having a divisor polynomial which all share the same given period, or used in a decoding system corresponding to the coding system, comprising writing binary symbols in a table having a first number of columns, equal to the period of the coders, and a second number of rows, performing first permutations of the symbols on each of the columns, and performing second permutations of the columns with each other, the second permutation preserving the property of return to zero of the coders.

43 Claims, 17 Drawing Sheets

Figure 1:
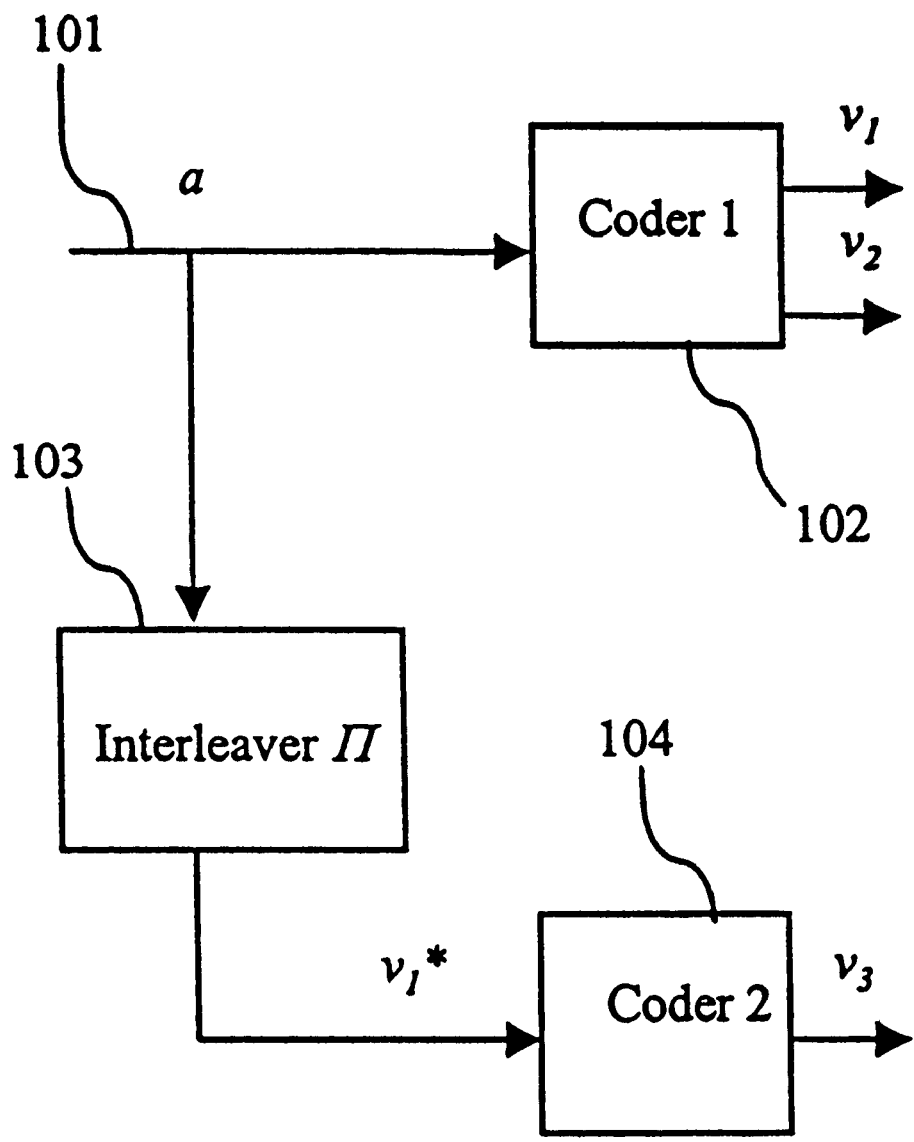

ROM:
Program
Interleavers $\Pi$ for each possible $n$

RAM:
$n$
$u, a$
$v_1, v_2, v_3$
Radio frame to be transmitted

*Fig. 5*

ROM:
Program
Interleavers $\Pi$ and $\Pi^{-1}$ for each possible $n$

RAM:
$n$
$\underline{u}, \underline{a}$
$\underline{v}_1, \underline{v}_2, \underline{v}_3$
Radio frame received

*Fig. 6*

ROM:
Program
$E$ = Table of values of interleaver parameters according to the possible $n$ values

RAM:
n, E(n) : interleaver parameters for the value of n under consideration
Interleaver $\Pi$ generated
u,a,a'
v1, v'1, v2,v'2, v3
Radio frame to be transmitted

*Fig. 7*

ROM:
Program
E = Table of values of interleaver parameters according to the possible n values

RAM:
$n, E(n)$ : Interleaver parameters for the value of $n$ under consideration
Interleavers $\Pi$ and $\Pi^{-1}$ generated $u,a,a'$
$v_1, v'_1, v_2, v'_2, v_3$
Radio frame received

*Fig. 8*

```
j=0
For i=0 to (M-1)
    While (PermParent(j)>M-1)
        j=j+1
    End While
    Perm(i)=PermParent(j)
EndFor
```

*Fig. 17*

INTERLEAVING DEVICE AND METHOD FOR TURBOCODING AND TURBODECODING

The present invention concerns an interleaving method and device used by systems for turbocoding or turbodecoding binary sequences, which may be of variable length, and systems using them.

It applies equally well to the coding of data representing a physical quantity, to the coding of data in the form of codes able to modulate a physical quantity, to the decoding of data-modulated signals, and to the decoding of data representing a physical quantity. These data can, for example, represent images, sounds, computer data, electrical quantities or stored data.

In general terms, a turbocoder uses at least two recursive convolutional coders and at least one permutation circuit also referred to as an interleaving circuit or interleaver. The corresponding iterative decoder is referred to as a turbodecoder.

Turbodecoders are nowadays envisaged for use in third-generation mobile systems, notably for certain data services.

On these subjects, documents served as a reference are, on the one hand, the article by Messrs. C. BERROU, A. GLAVIEUX and P. THITIMAJSHIMA entitled "*Near Shannon limit error-correcting coding and decoding: turbocodes*" published with the reports of the conference "ICC'93", 1993, pages 1064 to 1070, and on the other hand of the article by Messrs C. BERROU and A. GLAVIEUX entitled "*Near Optimum error-correcting coding and decoding: turbo-codes*" published by IEEE Transactions on Communication, Volume COM-44, pages 1261 to 1271, in October 1996.

The construction of permutation devices is far from being perfectly mastered. In general, this device uses square or rectangular matrices in which one row after another is written and one column after another is read. These matrices are generally very large, for example of size 256×256.

According to another method, in an article entitled "*Weight distributions for turbo-codes using random and nonrandom permutations*" published by the Jet Propulsion Laboratory, with "TDA Progress Report", number 42–122, Aug. 15, 1995, Messrs. DOLINAR and DIVSALAR consider the permutations which, numbering the k information positions between 0 and k−1, move the binary information placed at a position i to a position e i+f, for "well chosen" values of e and f.

In this document, the authors give only one example where k is a power of 2. In addition, the authors do not discuss the possible mutual influence of the choice of the permutation device and the choice of the elementary convolutional coders (2, 1) to be used for generating the coded sequences produced by the turbocoder (3, 1).

The evaluation of one or more interleavers and a turbocode using them generally consists of simulating the use of the turbocode on a transmission channel with different values of the signal/noise ratio and measuring the minimum value of this ratio for which a predetermined error probability on the binary values is reached.

However, the use of simulations as an evaluation tool can lead to a few problems. In particular, the consequences of a non-return to zero are concealed.

For example, the permutation device will be considered with k=65536=256×256, mentioned above, and a predetermined error probability equal to $10^{-5}$ will be chosen for simulating the performance of a turbocode using this device. Consequently, the mean number of errors on the binary values per block of 256×256 will be close to 1, but it will not be known whether each binary information item has the same error probability. This error probability could be fairly high for binary values having an "unlucky" position in the permutation device, and this probability could be much smaller for more "lucky" positions.

One possible method for remedying this situation is to produce a harmonious conjoint design of the permutation device and two convolutional coders in order to guarantee reasonable uniformity of the error rate on the binary values after decoding, according to the position of the binary information in the permutation device.

Another problem concerns the lack of algebraic tools for specifying the permutation devices. It could be useful to have available means for specifying a selection of permutation devices having performances representing the set of all the permutation devices.

The invention concerns mainly the transmission of information represented by sequences of binary symbols:

$$u=(u_0, u_1, \ldots, u_{k-1}),$$

referred to as "information sequences", which will be coded as a triplet of binary sequences, $$v=(a, b, c),$$

each of these sequences a, b and c, by itself, representing the sequence u.

In the remainder of the description, use is made indifferently, for representing a sequence u, of the form $u=(u_0, u_1, \ldots, u_{k-1})$, and the associated polynomial form:

$$u(x)=u_0 x^0 + u_1 x^1 + \ldots + u_{k-1} x^{k-1}.$$

Equivalent notations will be used for the sequences a, b and c. Using this second representation, it is known, for determining the triplet v=(a, b, c):

to choose a(x)=u(x);
to choose b(x)=u(x).$h_1$(x)/g(x),
where g(x) is a polynomial, for example g(x)=1+x+$x^3$, corresponding, according to the representation in sequence, to the sequence (1, 1, 0, 1); and $h_1$(x) is a polynomial, for example $h_1$(x)=1+x+$x^2$+$x^3$, corresponding to the sequence (1, 1, 1, 1); and
calling a* a sequence formed by permutation of the binary data of the sequence a, to choose c(x)=a*(x).$h_2$(x)/g(x) where $h_2$(x) is a polynomial, for example $h_2$(x)=(1+ $x^2$+$x^3$) corresponding to the sequence (1, 0, 1, 1).

Any choice of the polynomials g(x), $h_1$(x), $h_2$(x) and of the permutation specifying the interleaver which associates the permuted sequence a* with the sequence a, specify the coder which will be referred to as a "turbocoder". All the sequences which can produce a specified turbocoder will be referred to as a "turbocode".

In the remainder of the description, the elementary recursive convolutional coder which produces the sequences b will be referred to as the "first coder", and the one which produces the sequence c will be referred to as the "second coder".

The polynomial divisions used are of the division according to increasing powers type, well known to persons skilled in the art. They use modulo 2 arithmetic. The sequences a, b and c are binary sequences and in the general case the divisions which define b and c have a remainder.

This type of coding method has the advantage of lending itself to a high-performance iterative decoding, of low complexity and inexpensive.

For implementing the turbocoding, several questions arise:

I/ How to choose the polynomials g(x), $h_1(x)$ and $h_2(x)$?

II/ How to choose the permutation of the terms of the sequence a which produces the sequence a*?

Amongst the choices proposed, three examples of interleavers, that is to say operators which permute the terms of the sequence a, in order to form the sequence a*, are given below:

A) in the first example, after having stored the terms of a in a rectangular table, successively row by row and, for each row, from left to right, the sequence a* is formed by taking the terms successively from this table column after column and, for each column, from top to bottom. For example, in the case of sequences of six terms and the use of a table of two rows of three columns, the interleaver transforms the sequence a =$(a_0, a_1, a_2, a_3, a_4, a_5)$ into the sequence a*=$(a_0, a_3, a_1, a_4, a_2, a_5)$.

B) in a second example, the i-th term (i=0, 1, 2, . . . ) a*i of the sequence a* is chosen as being the term $a_j$ of the sequence a, with j=s.i+t calculated modulo the number of terms of the sequence a, s and t being integers. For example, if the number of terms in the sequence a is six and if s=5 and t=3, the interleaver transforms the sequence a =$(a_0, a_1, a_2, a_3, a_4, a_5)$ in the sequence a*=$(a_3, a_2, a_1, a_0, a_5, a_4)$.

C) in the third example, the chosen permutation is random.

III/ How to avoid the division defining b(x) having a remainder? and

IV/ How to avoid the division defining c(x) having a remainder?

Replying to these last two questions amounts to resolving a problem frequently mentioned in the literature on turbocodes, which is that of the "return to the zero state" of the elementary convolutional coders defining b and c. Since the turbocoders have two elementary recursive coders, the second of which uses a permutation a* of the sequence a, it is wished to guarantee that the polynomials a(x) and a*(x) representing the information sequence u(x) are simultaneously divisible by g(x). Ensuring this divisibility of a(x) is simple since it suffices to construct a(x) from u(x), supplementing u(x) with padding symbols, equal in number to the degree of g(x) whose sole function is to guarantee the absence of a remainder in the division used to produce b(x) from a(x).

Choosing a permutation using a*(x) from a(x) which guarantees both the divisibility of a*(x) by g(x) and good error correction performance for the turbocode thus specified is, on the other hand, more difficult.

This problem can give rise to disparities between the probabilities of errors after decoding the different bits constituting u(x).

In an article which appeared in Volume 31, No. 1 of the journal "Electronics Letters" on Jan. 5, 1995, Messrs. BARBULESCU and PIETROBON disclosed that an interleaver can be described by successively and cyclically storing the terms of the sequence a in a number of sequences equal to the degree of the polynomial g(x) incremented by one, and that, in this case, permutations internal to each of the sequences thus formed give rise to equality between the remainder of the division defining the sequence b and that of the division defining the sequence c.

However, and contrary to what is said in this article, this statement is true only if the polynomial g(x) is of the form $\Sigma_{i=0 à m} x^i$.

In an article entitled "Turbo-block-codes" published with the reports of the seminar "Turbocoding" organised by the Institute of Technology of Lund (Sweden) (Department of Applied Electronics) in August 1996, Messrs. C. BERROU, S. EVANO and G. BATTAIL disclosed that, by arranging the terms of the sequence u, cyclically, in a number of columns equal to a multiple of the degree N0 of the polynomial of type $x^n-1$ with the lowest strictly positive degree which is divisible by g(x), permutations internal to each of the columns thus formed mean that the sum of the remainder of the division defining the sequence b and that of the division defining the sequence c is nil, so that the concatenation of the sequences is divisible by g.

This document, like the previous one, therefore restricts the choice of interleavers to particular forms working independently on subsets of the terms of the sequence a by applying internal permutations to them. It does not however guarantee that individually a(x) and a*(x) will be divisible by g(x). The only guarantee is the divisibility by g(x) of the polynomial representing the concatenation (a, a*), consisting of putting the two sequences a and a* end to end.

The result is a possible loss in efficiency of the decoder since the latter is not informed of the state which the coder had at the instant marking the end of the calculation of b and the start of the calculation of c.

None of the articles cited proposes an effective choice of interleaver.

With a view to mitigating these drawbacks, the inventors firstly developed a solution guaranteeing the return to zero not only of the control sequence coming from the first coder but also that issuing from the second coder. This solution must satisfy the following condition and is set out in the following paragraph:

A turbocoder with an efficiency of 1/3 can be considered as a pair of systematic convolutional coders (see FIG. 1) with divisor polynomials such that the first coder produces a control sequence from the sequence of symbols to be coded u and the second coder produces a control sequence from an interleaved sequence u* obtained by interleaving the sequence u. In this context, the simultaneous return to zero of two coders is a classic problem. A way of resolving it has been found by the inventors and is summarised below.

Let g(x) be the divisor polynomial of a turbocoder. Let m be the degree of the polynomial g(x) and N0 the smallest integer such that g(x) is a divisor of the polynomial $x^{N0}+1$. This number N0 will be referred to as the "period" of g(x).

Let also n be a multiple of N0: n=M.N0.

A sequence of symbols, u, then has a polynomial representation, u(x), of degree n−m−1, with binary coefficients, and this polynomial u(x) is pre-encoded as:

$$a(x)=u(x)+\Sigma_{i=n-m \text{ à } n-1} a_i x^i$$

where the m binary symbols $a_i$ are chosen so that a(x) is a multiple of g(x).

In general terms, the inventors discovered that the interleavers guaranteeing return to zero, not only of the control sequence coming from the first coder but also of that issuing from the second coder, should meet the following conditions:

each "permuted" sequence, $a_{ij}$*, (i=1, . . . , K; j=1, . . . , M1), is obtained by a permutation of the corresponding sequence $a_i$, said permutation being, in a representation where the binary data of each sequence $a_i$ are written, row by row, in a table with N0 columns and M rows, N0 being the smallest integer such that each divisor polynomial $g_i(x)$ divides $x^{N0}+1$, the resultant of any member of so-called elementary permutations which, each:

either has the property of transforming the cyclic code of length N0 and with generator polynomial $g_i(x)$ into an equivalent cyclic code with generator polynomial $g_{ij}(x)$ which can be equal to $g_i(x)$, and acts by permutation on the N0 columns of the table representing $a_i$, or is any permutation of the symbols with a column in said table.

This method applies to blocks with a given length enabling each of the elementary coders to be reset to zero in a suitable fashion. However, the input sequence must have a certain length depending solely on the divisor polynomial or polynomials used. This must be a multiple of a number N0.

When the sequence of symbols to be coded does not correspond to this number (this is to say when the sequence of symbols to be coded, to which so-called "padding" symbols are added, which guarantee the divisibility of the polynomial representation of the resulting sequence, by a predetermined polynomial, as a length which is not a multiple of N0), the initial teaching of the inventors cannot be used directly. The same applies when the length of the sequence varies from one sequence to another.

In addition, the transmission conditions, the required efficiency, the type of data, the type of transmission channel and the signal/noise ratio of the channel are not taken into account, in the first stage of the invention made by the inventors, this first stage not forming part of the prior art of the present invention, but, quite the contrary, supplying essential characteristics thereof.

In addition, in a turbocoder, the sizing of the memory cannot be adapted easily to transmission modes taking into account different block lengths.

If the pseudo-random interleavers of the state of the art are considered, it is necessary to store all the interleavers liable to be used and the memory size required can be large.

The present invention aims to obtain a family of interleavers which offers good performance, low complexity and great flexibility for varied sizes which can range from 320 to 8192 bits.

For this purpose, it is notably important to have the property of preserving divisibility by the feedback generating polynomial used in the coders making up the turbocoders, or intrinsic return to zero property of the coders making up the turbocoder.

This property makes it possible to obtain the best performance in the case of small sizes of interleavers.

The present invention aims to remedy the drawbacks of the prior art, by providing a device and a method for interleaving binary data which define a family of interleavers having different sizes, and such that each of the interleavers in this family has optimum performance.

To this end, the invention proposes a method of interleaving binary symbols representing a physical quantity, used in a coding system with at least two recursive convolutional coders having respectively a divisor polynomial having a same given period or in the corresponding decoding system, characterised in that it includes operations of:

writing binary symbols in a table having a first number of columns equal to the period of the coders and a second number of rows, first permutations of the symbols on each of the columns, and second permutation of the columns with each other, said second permutation preserving the property of return to zero of the coders.

In this way good performance and great flexibility are obtained.

According to preferred alternative characteristics:

the first permutations are derived from each other, passing from one column to the next, by shifting modulo the second number, the first permutations are derived from each other, passing from one column to the next, by a shifting which is substantially the same for all the columns, the first permutations are derived from each other, passing from one column to the next, by a shifting which is the same for all the columns, when the second number is a multiple of the first number, the first permutations are identical to each other.

These characteristics are simple to implement, whilst offering good performance.

According to other preferred alternative characteristics:

the first permutations are of the algebraic type, with at least one dimension, the first permutations are obtained by extraction performed on an interleaver of larger size, which is for example a power of two, the first permutations are pseudo-random.

These characteristics are simple to implement, whilst offering good performance.

According to other preferred alternative characteristics:

the second permutation is circular, the columns being numbered in increasing binary numbers, the second permutation is circular on the bits of the column numbers.

These characteristics are simple to implement, whilst offering good performance.

The invention also relates to an interleaving device comprising means for implementing the above features.

The invention also relates to a coding method and a decoding method including the interleaving method previously disclosed.

The invention also concerns a coding device and a decoding device including means for implementing the above features.

The invention also relates to:

a device for processing signals representing speech, which includes a device as succinctly disclosed above, a data transmission device including a transmitter adapted to implement a packet transmission protocol, which includes a device as succinctly disclosed above, a data transmission device including a transmitter adapted to implement the ATM (asynchronous transfer mode) packet transmission protocol, which includes a device as succinctly disclosed above, a data transmission device including a transmitter adapted to implement the packet transmission protocol on a network of the ETHERNET (registered trade mark) type, a network station, which includes a device as succinctly disclosed above, a data transmission device including a transmitter transmitting over a wireless channel, which includes a device as succinctly disclosed above, and a device for processing sequences of signals representing at most one thousand binary data, which includes a device as succinctly disclosed above.

These coding and decoding devices, these coding and decoding methods and these signal processing, data transmission and sequence processing devices and this network having the same particular characteristics and the same advantages as the coding method as succinctly disclosed above, these particular characteristics and these advantages are not repeated here.

An information storage means, possibly partially or totally removable, which can be read by a computer or by a microprocessor, stores instructions of a computer program which makes it possible to implement the method of the invention as succinctly disclosed above.

Figure 2:
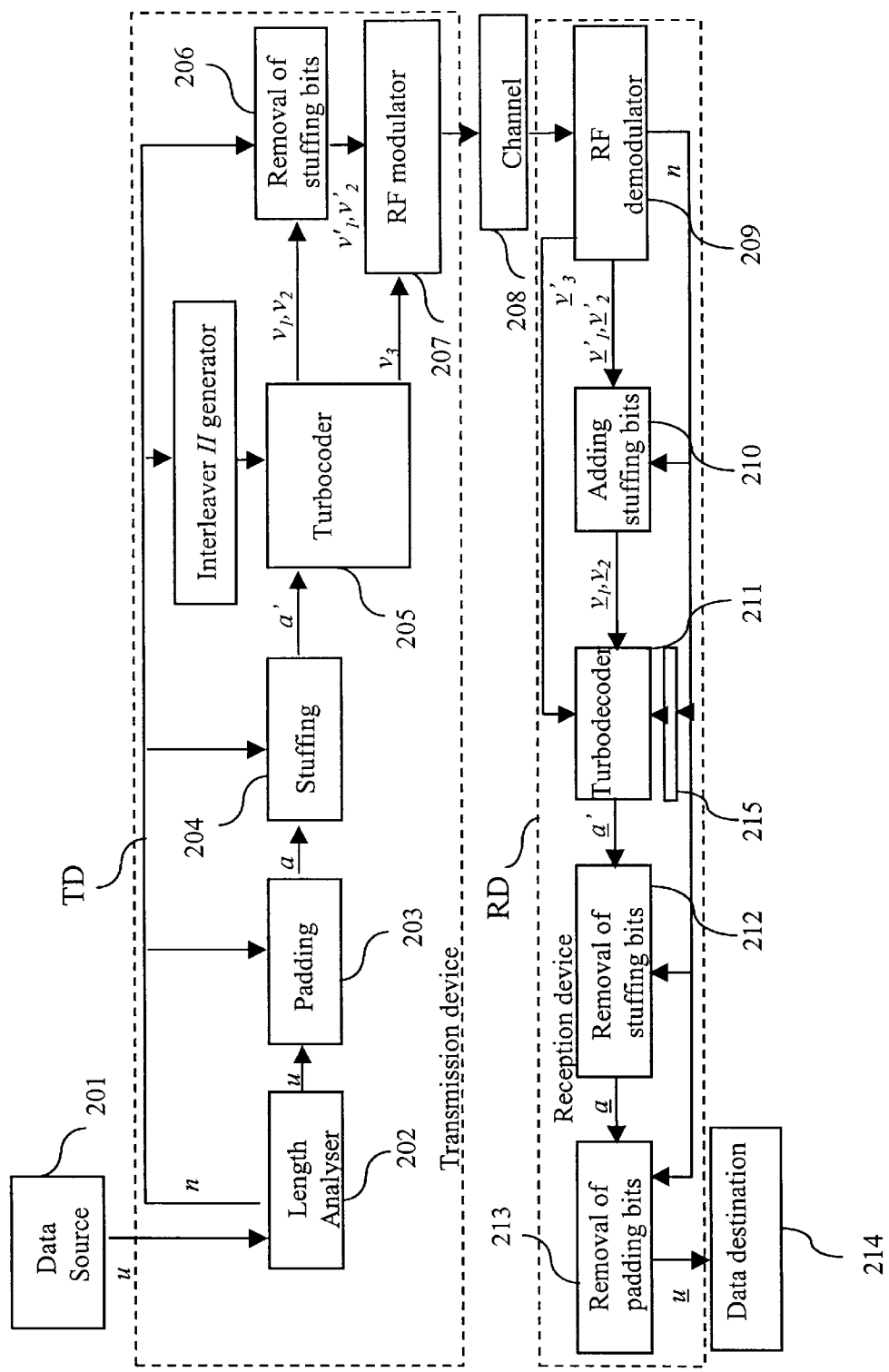
Figure 3:
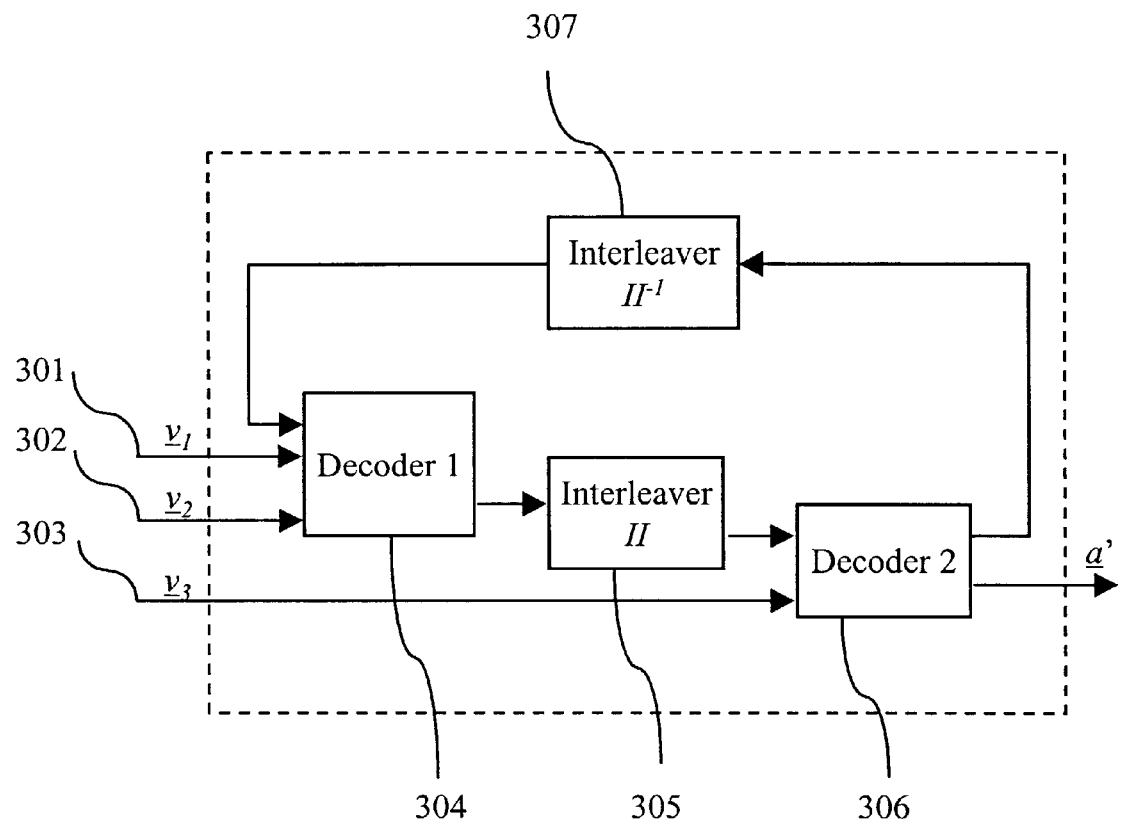
Figure 4:
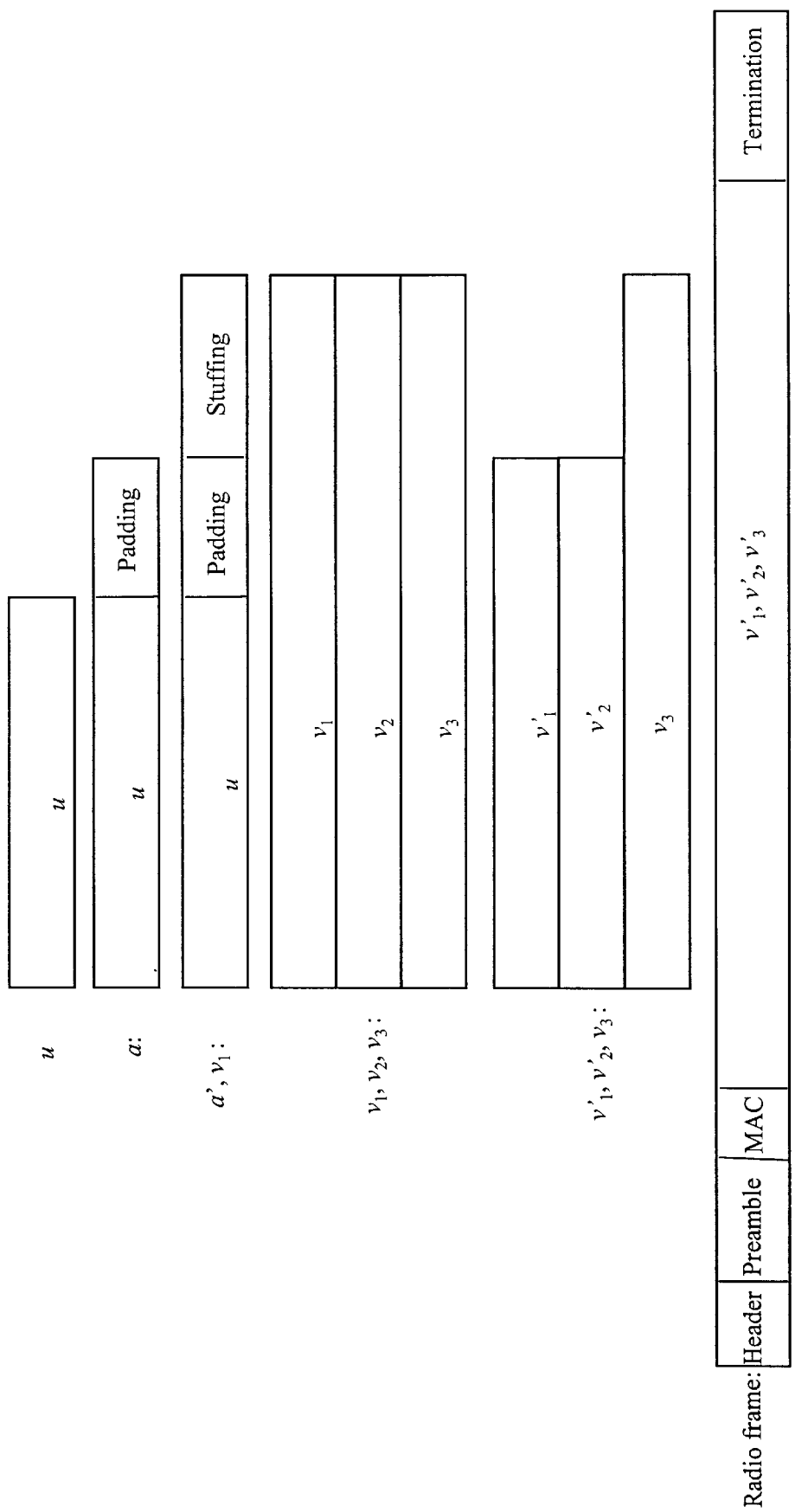
Figure 9:
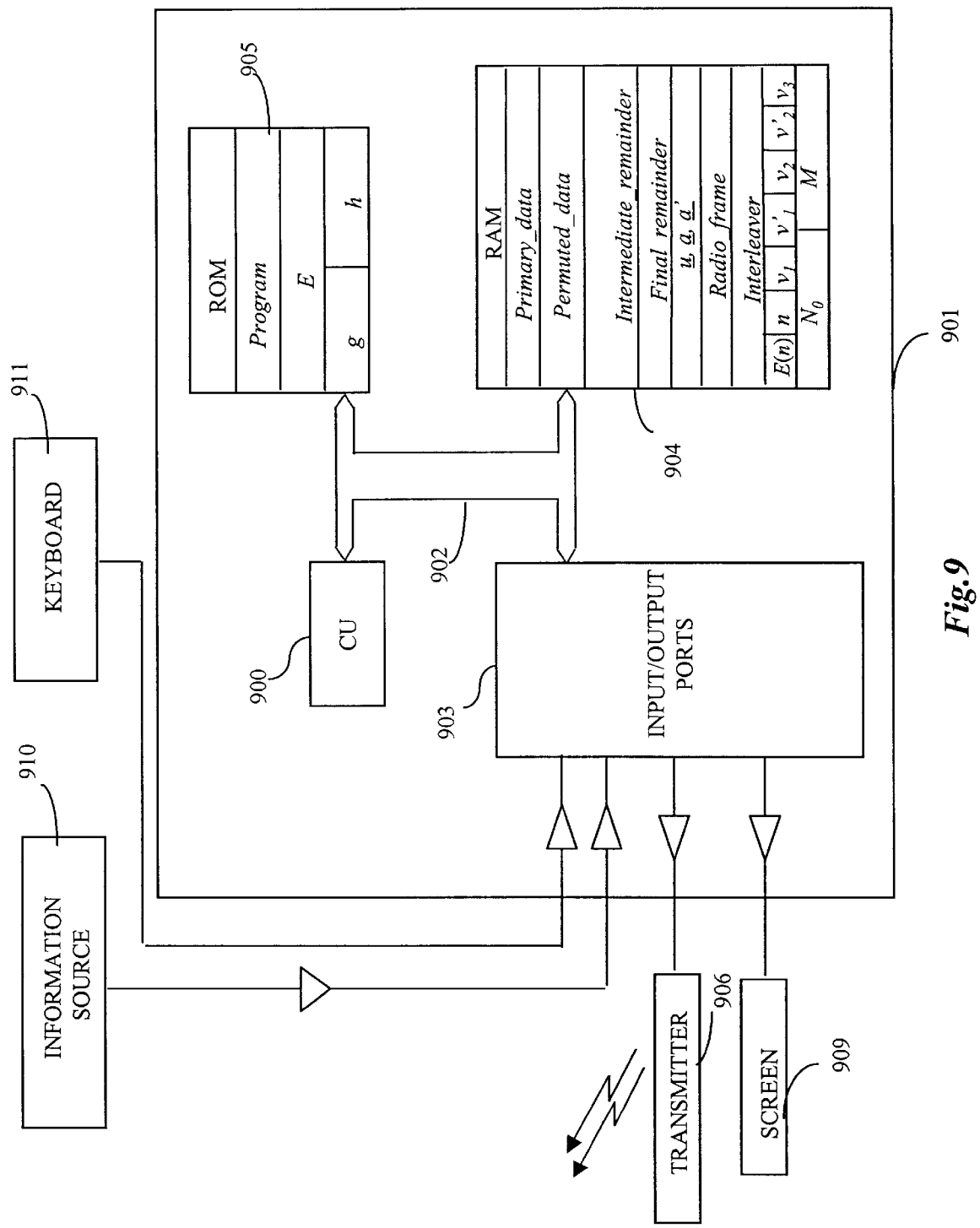
Figure 10:
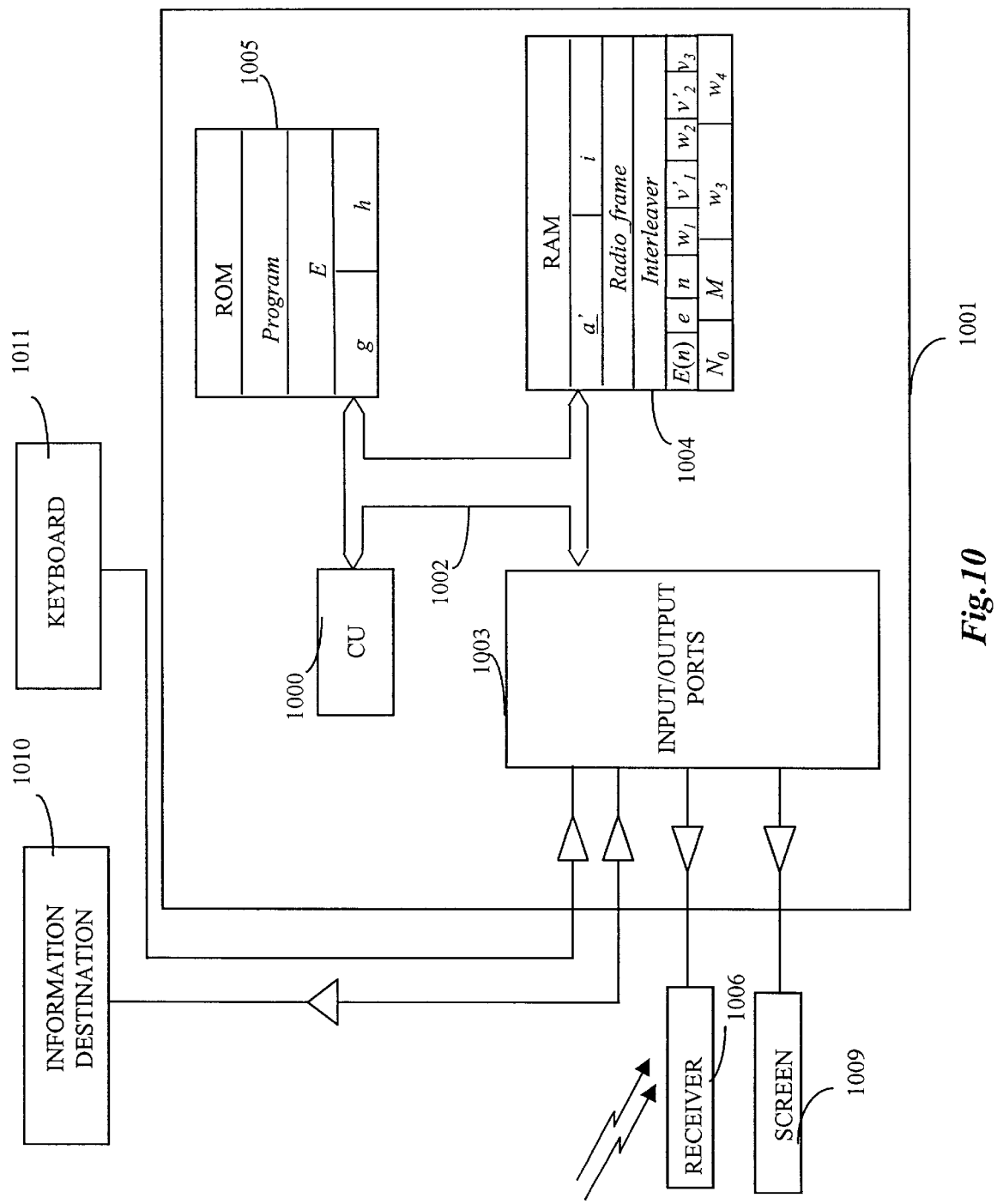
Figure 11:
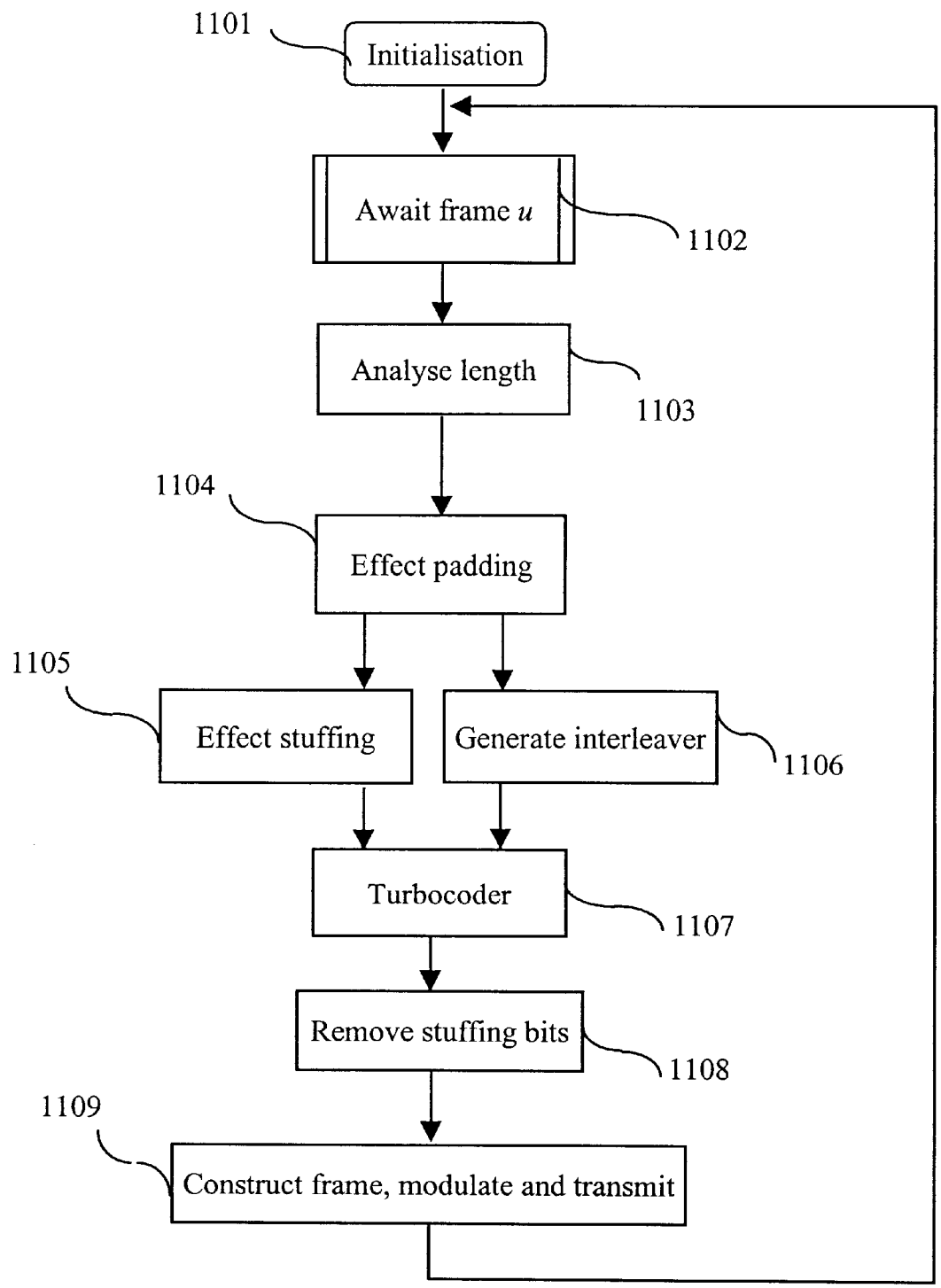
Figure 12:
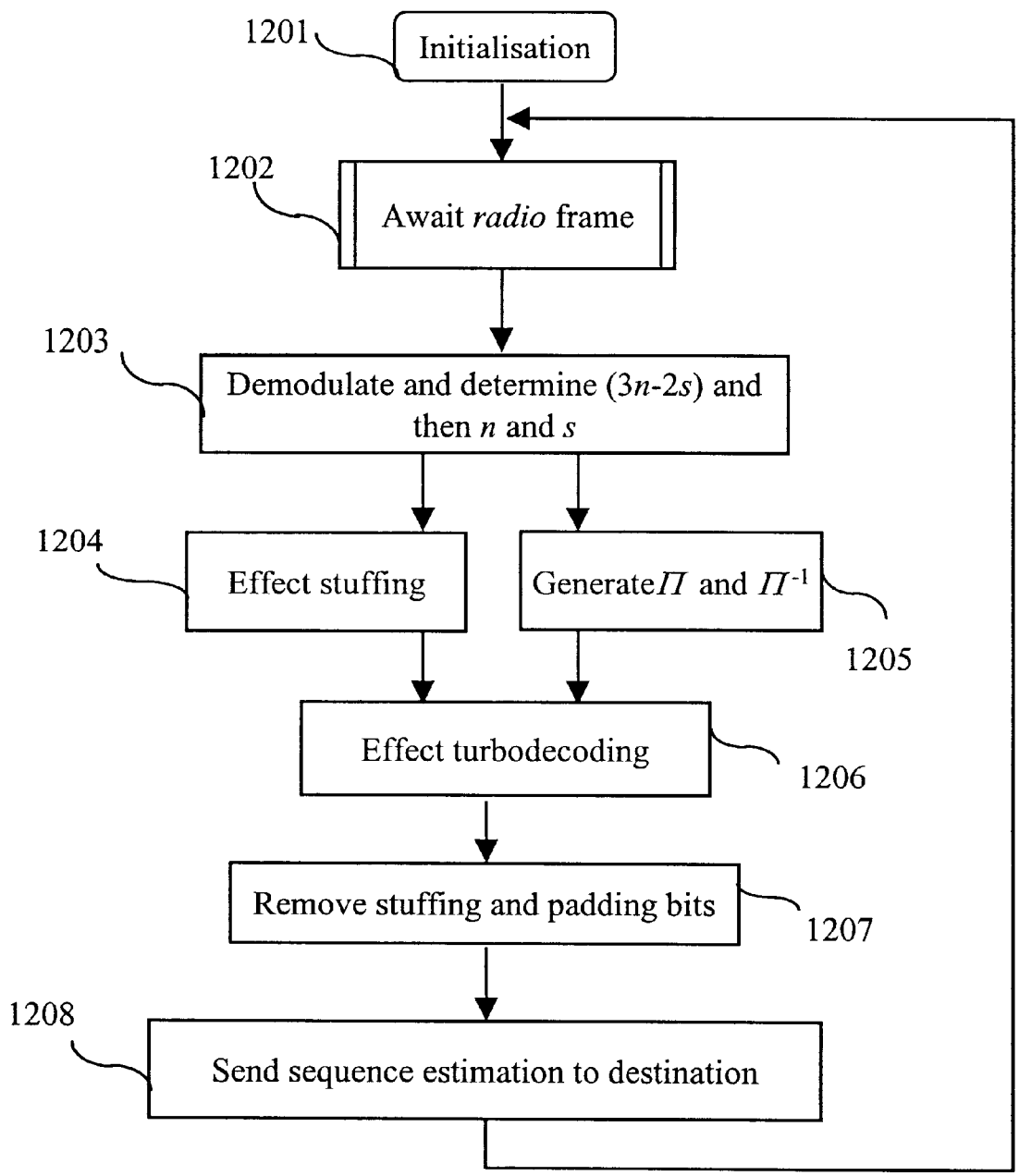
Figure 13:
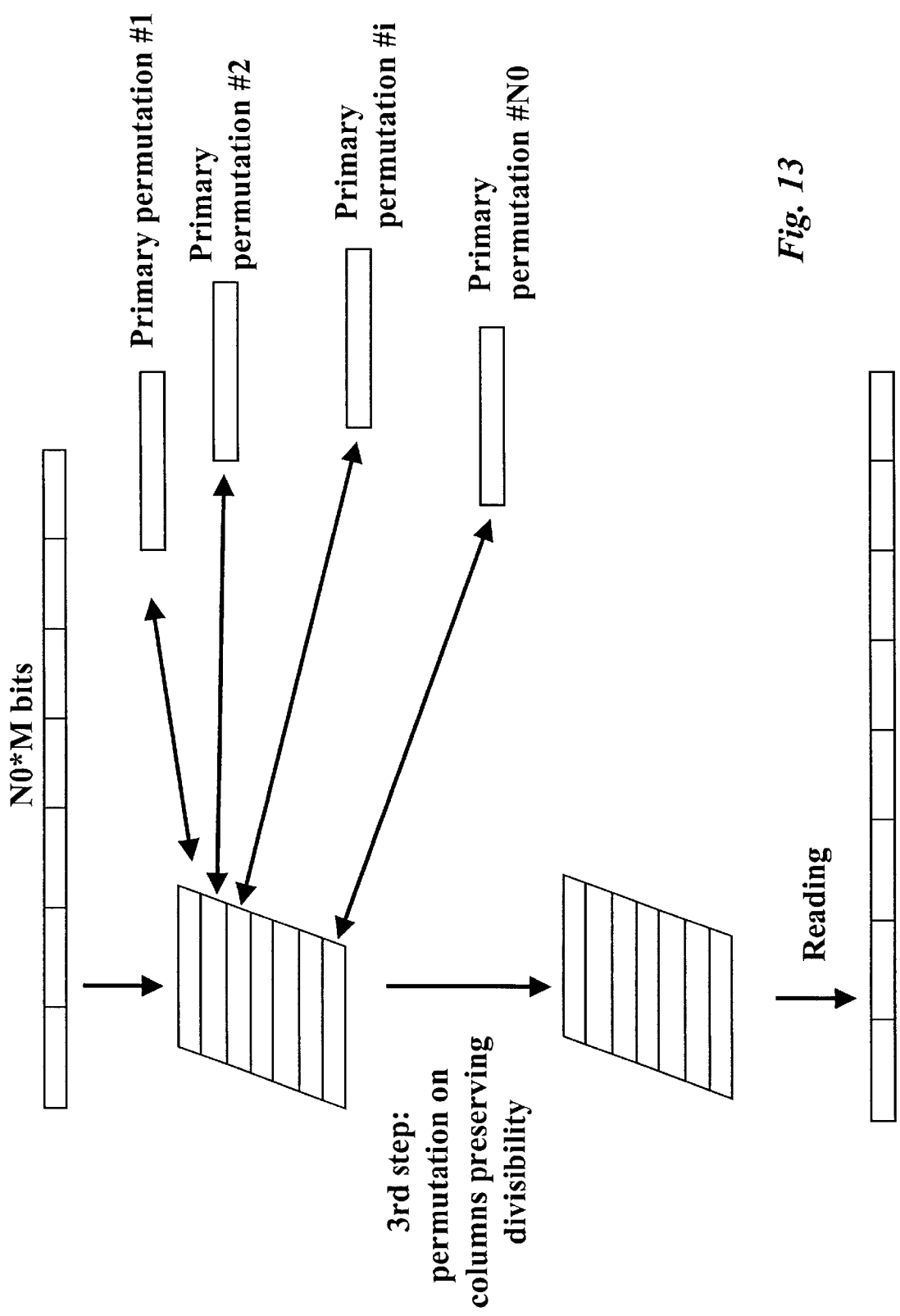
Figure 14:
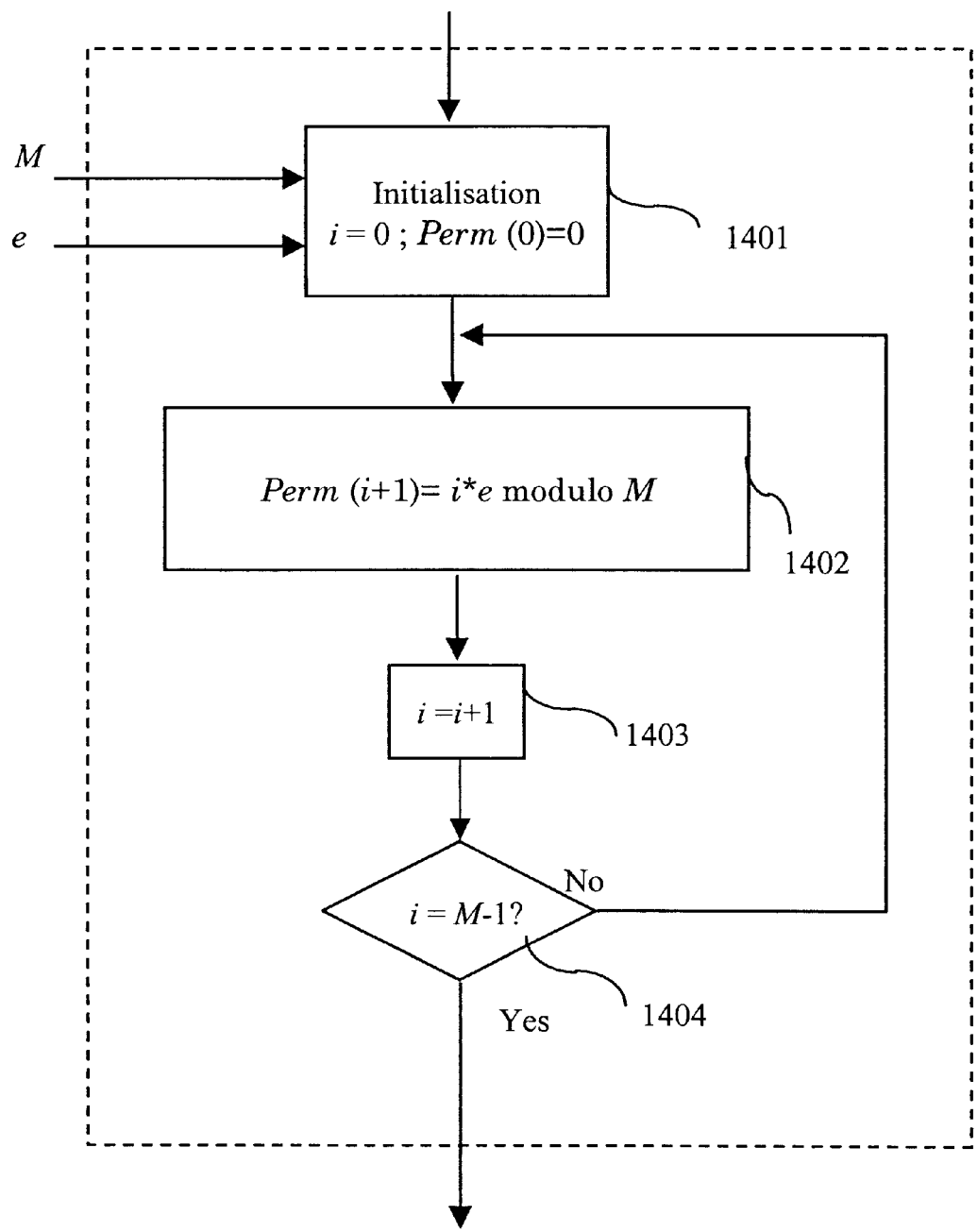
Figure 15:
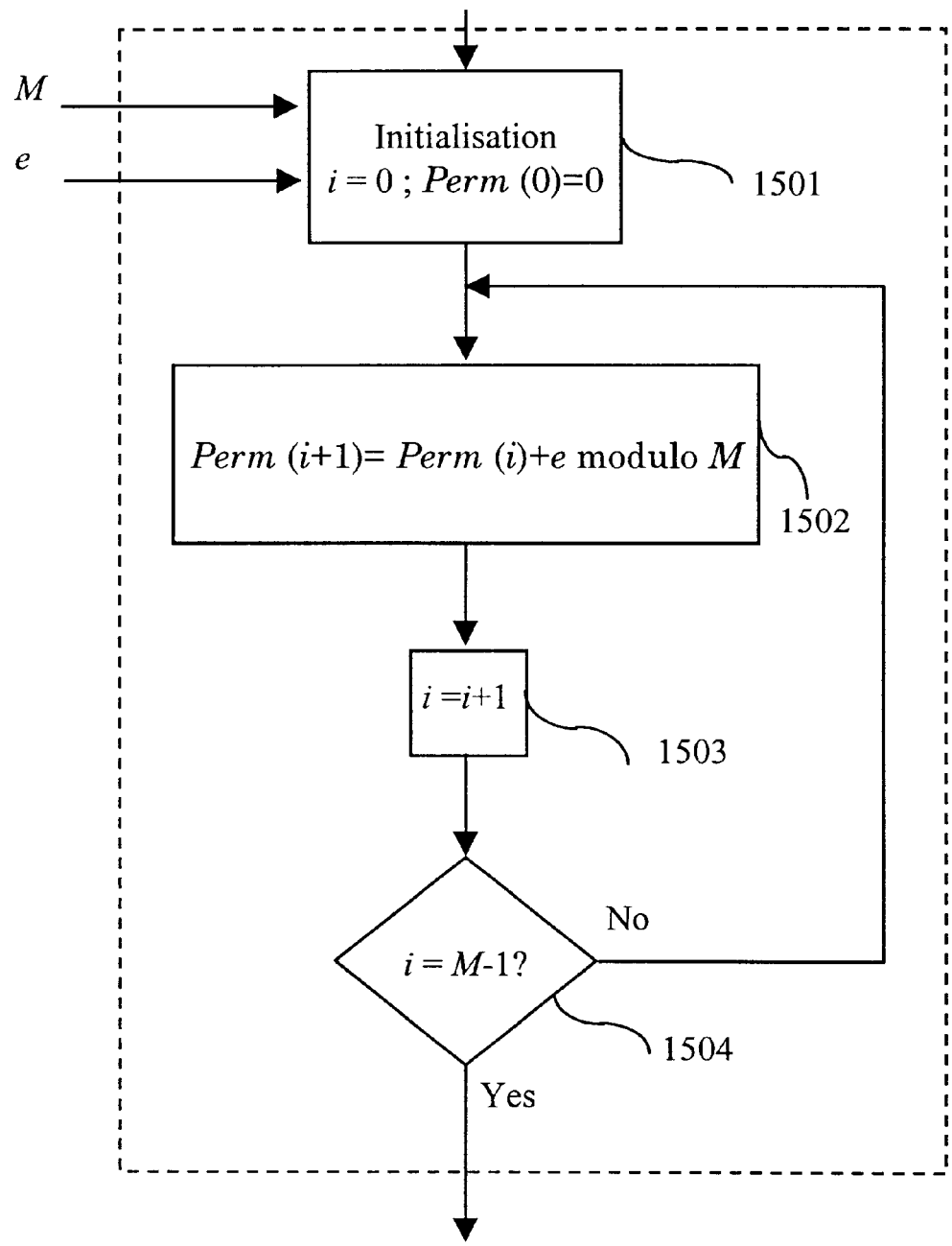
Figure 16:
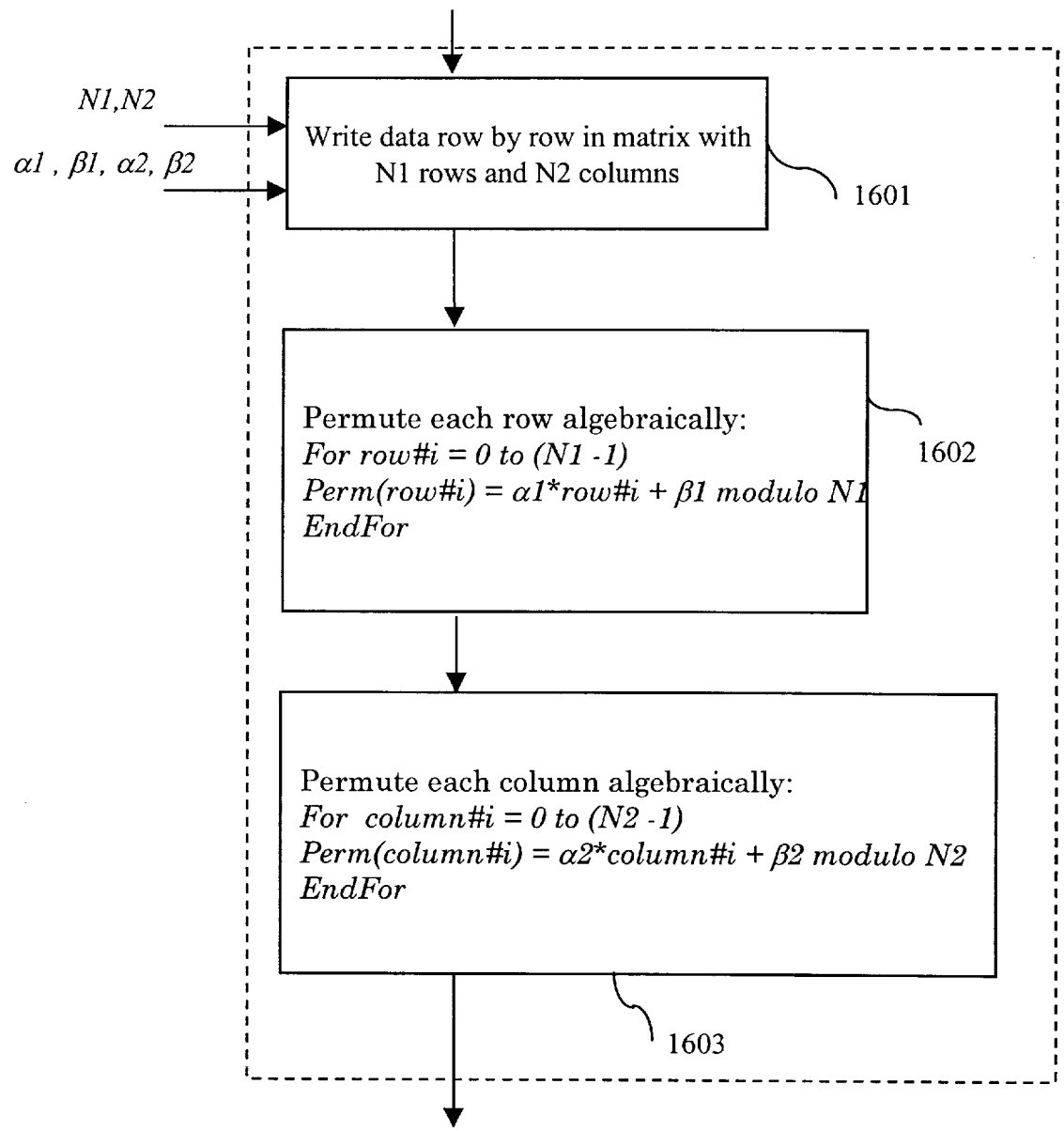

Other advantages, aims and characteristics of the present invention will emerge from the following description, given with regard to the accompanying drawings, in which:

FIG. 1 depicts, in the form of a block diagram, a turbocoding device according to the prior art, FIG. 2 depicts, in the form of a functional block diagram, a turbocoding device and a turbodecoding device of a first embodiment of the present invention, in which turbocoding and turbodecoding parameters are functions of a number of symbols to be transmitted, FIG. 3 depicts, in the form of a block diagram, a turbodecoding device according to the first embodiment of the present invention, FIG. 4 depicts sequence and frame formats used in the first embodiment of the present invention, FIGS. 5 to 8 depict memory registers of a turbocoding device and of a turbodecoding device, in the first embodiment of the present invention, FIG. 9 depicts, schematically, the components of a coding device adapted to implement the first embodiment of the present invention, FIG. 10 depicts, schematically, the components of a decoding device adapted to implement the first embodiment of the present invention, FIG. 11 depicts an operating flow diagram of the coding device illustrated in FIG. 9, FIG. 12 depicts an operating flow diagram of the decoding device illustrated in FIG. 10, FIG. 13 depicts an interleaver of the multiple-stage algebraic type according to one embodiment of the invention, FIG. 14 depicts a one-dimension algebraic permutation embodiment, FIG. 15 depicts another one-dimension algebraic permutation embodiment, FIG. 16 depicts a two-dimension algebraic permutation embodiment, FIG. 17 depicts an algorithm for extracting an interleaver from an interleaver of larger size.

In FIG. 1 it can be seen that a parallel turbocoding device according to the state of the art prior to the present invention includes essentially:

an input for symbols to be coded 101, where a source, not shown, supplies a sequence of binary symbols to be transmitted, or "to be coded", a, a first coder 102, which supplies, from the sequence a, two sequences $v_1$ and $v_2$ of symbols representing the sequence a, an interleaver 103, which supplies, from the sequence a, an interleaved sequence a* whose symbols are the symbols of the sequence a, but in a different order, and a second coder 104, which supplies, from the interleaved sequence a*, a third sequence, $v_3$, representing the sequence a.

The three sequences $v_1$, $v_2$ and $v_3$ are transmitted so as then to be decoded.

The remainder of the description deals with simple interleavers to be generated, which, 1/ from sequences $a_i$ having:
  a polynomial representation $a_i(x)$ which is a multiple of a polynomial $g_i(x)$, and
  a number of binary data equal to the product of the integer number M and the integer N0, the smallest integer such that the polynomial $X^{N0}+1$ is divisible by each divisor polynomial $g_i(x)$;

2/ produce so-called "permuted" sequences, $a_{ij}^*$, (i=1, ... ,K; j=1, ... ,M1), each sequence $a_{ij}^*$
  being obtained by a permutation of the corresponding sequence $a_i$, said permutation being, in a representation where the binary data of each sequence as are written, row by row, in a table with N0 columns and M rows, the resultant of any number of so-called elementary permutations which, each:
  either has the property transforming the cyclic code of length N0 and with a generator polynomial $g_i(x)$ into an equivalent cyclic code with a generator polynomial $g_{ij}(x)$ which can be equal to $g_i(x)$, and acts by permutation on the N0 columns of the table representing $a_i$,
  or is any permutation of the symbols of a column in said table; and
  having, consequently, a polynomial representation $a_{ij}^*$(x) which is equal to a polynomial product $c_{ij}(x)g_{ij}(x)$,
  at least one permuted sequence $a_{ij}^*$ being different from the corresponding sequence $a_i$, 3/ so that elementary coders produce redundant sequences whose polynomial representation is equal to $\Sigma f_{ij}(x) c_{ij}(x)$, for j=1, ... ,M1, each polynomial $f_{ij}(x)$ being a polynomial with a degree at least equal to the degree of the polynomial $g_{ij}(x)$ with the same indices i and j.

Likewise, the following description has been limited to the case where a single sequence is coded, although the present invention applies equally well to cases where several sequences of symbols are conjointly and simultaneously coded.

The present invention has been limited to parallel turbocodes, but it applies, with adaptations within the capabilities of the person skilled in the art, to serial turbocodes and hybrid turbocodes (having a serial turbocoding part and a parallel turbocoded part).

The first coder, 101, used here is a systematic coder, that is to say the sequence $v_1$ is identical to the sequence a.

Finally, there is a polynomial g(x) of "period N0" and degree m used as a divisor polynomial in the two elementary coders 102 and 104.

In FIG. 2, it can be seen that, for implementing the present invention, a source of symbols 201 supplies a sequence of binary symbols u to a transmission device TD. Such an "information source" produces sequences of symbols to be coded, n' representing the length of a relevant sequence of symbols to be coded.

This sequence is analysed by a length analyser 202, which determines the number n' of binary symbols constituting the sequence u and determines all the operating parameters of the turbocoder:

a number K, greater than or equal to 1, of sequences us (i=1, ... , K) of binary symbols, to be coded,
an integer M1, equal to or greater than 1,
a divisor polynomial $g_i(x)$,
an integer M,
an interleaver,
a multiplier polynomial $f_{ij}(x)$, and
a sequence length, n.

With regard to the determination of the number n, knowing the degree m−1 of the polynomial g(x), this number n complies with the conditions of being:

greater than or equal to (n'+m), and a multiple of N0, the smallest integer such that $x^{N0}+1$ is divisible by g(x).

Preferentially, n is the smallest number satisfying these conditions.

The operation of selecting the parameters of the interleaver is explained by an example: if, as assumed in the embodiment described and depicted, this is an interleaver of the algebraic type, n being determined, it suffices to select the values of the parameters defining this interleaver.

For this, a table will have previously been constructed, giving, for each possible value of n the best values of these parameters which will previously have been defined by the designer of the system by code distance spectrum calculations or simulations. It is then only necessary to read in this table, placed in a non-volatile memory, the values of these parameters.

According to a variant, not shown, during the operation 202, it is not the length n' of the sequence u to be coded which serves as a unique criterion of choice of the transmission parameters, but one or more criteria, taken from amongst the following:

the length of the sequence u of symbols $u_i$ to be coded, a channel for transmitting the sequence coded, the signal/noise ratio of the coded sequence transmission channel, the data type represented by the symbols to be coded (audio data, video data, computer file data, etc), a guaranteed service quality for the transmission of the symbols to be coded, and a coding efficiency, are used for optimising a compromise between coding and/or decoding ease, speed of decoding, passband, in terms of number of symbols or frames correctly transmitted per second, transmission time for each symbol, according to the criteria of choice considered.

For implementing this variant, the criteria used for coding must be used for decoding. For this purpose, either, by design, these criteria are fixed, both in the coding device and in the decoding device, or their value can be directly determined at decoding by analysing the radio frame (see operation 209 below), or the transmission of suitable information informs the reception device of certain criteria used. For example, the header of the radio frame can contain this information.

The interleaver being constructed so as to have limited complexity, this interleaver can be defined by a calculation made by a circuit in a simple fashion: there is no need to store the interleaving table corresponding to each possible length (see FIGS. 5 to 8). The interleaver being defined, the turbocoder performs the coding operation in a conventional fashion:

a "padding" operation, 203, is an operation which consists of adding m bits so that the polynomial associated with the sequence produced a, is divisible by the polynomial g(x);

a "stuffing" operation, 204, is an operation which adds s nil bits to the sequence issuing from the padding operation, so that the sequence produced, a', has the length n; s is therefore given by the equation s=(n−n'−m); and a turbocoding operation, 205, of a known type determined by the divisor polynomial and the multiplier polynomials, of the first and second coders, on the one hand, and by the interleaver 103, on the other hand (in the embodiment illustrated in the figures, the multiplier polynomials are equal).

Following the turbocoding, a removal operation 206 is performed, during which:

the s nil bits added during the stuffing operation 204 are removed, from the sequence $v_1$, which, it will be recalled, is identical to the sequence a', since the first coder, 101, is systematic; the sequence resulting from the removal operation being referred to as $v'_1$ and having the length n−s;

the s parity bits corresponding, in the sequence $v_2$, to the nil bits added to the sequence $v_1$, during the stuffing operation 204, are removed from the sequence $v_2$ in order to produce a sequence referred to as $v'_2$ which thus has the length n−s.

Next, a modulation operation 207 is performed, of a known type, on a transmission channel 208, with encapsulation of the sequence in a radio frame, modulation and transmission of this frame over a transmission channel.

In the reception device RD, there is performed an operation 209 of the modulated signals received on the channel 208, during which the demodulator uses the structure and/or the information peculiar to the radio frame in order to determine the total length of the encapsulated sequence according to methods well known to persons skilled in the art of radio protocols. The length of this sequence being equal to (3n−2s), and s lying preferentially between 0 and (2N0−1) inclusive, 3n is the smallest integer greater than or equal to (3n−2s) which is a multiple of 3N0. This number can easily be determined and n and s are easily derived from it.

During the operation 209, the reception device demodulates the received signal, extracts the encapsulated sequence from the radio frame, analyses the length n of the sequence and derives therefrom the number of padding bits and the parameters of the turbodecoder. In the remainder of the description, each estimated sequence and the sequence of which it is the estimation is denoted in the same way in the reception and decoding device.

According to a variant which is not shown, during the operation 209, the decoding device recovers, for example in the header of the radio frame, information representing at least some of the criteria used by the coding device.

In the reception device, a means performing the "stuffing" operation 210 re-establishes the s stuffing bits in the estimated sequence $v'_1$ and the corresponding s parity bits in the sequence $v'_2$, the number s being a function of the sequence length n determined during operation 209. The decoding being effected from soft inputs related to the reliability of each symbol received. The stuffing bits and the corresponding parity bits are allocated a reliability value as high as possible corresponding to a nil hard bit.

During a decoding operation 215, an interleaver and its inverse interleaver (referred to as a "deinterleaver") are constructed according to the length of the sequence in a similar fashion to what is done in the coder. It may be noted that, as the interleaver is of low complexity, the inverse interleaver is also.

An inverse interleaver can also be generated from the interleaver, exchanging the roles of the rank of the interleaved value and of the rank of the value to be interleaved.

The turbodecoder 211 decodes the frame with the interleaver and the deinterleaver (see FIG. 3). The s stuffing bits and m padding bits are also removed (respectively during the stuffing bit removal operation 212 and padding bit removal operation 213) and the sequence is then transmitted to the data 214.

In FIG. 3, it can be seen that a decoding device consists essentially of:
- three inputs 301, 302 and 303 of sequences $v_1$, $v_2$ and $v_3$,
- a first decoder 304 corresponding to the coder 102 (FIG. 1) and receiving the sequences $v_1$ and $v_2$ and an extrinsic information sequence $w_4$ disclosed below, supplies an a posteriori estimation sequence $w_1$,
- an interleaver 305, identical to the interleaver 103 used in the coder, which receives the sequence $w_1$ and interleaves it as $w_2$,
- a second decoder 306, corresponding to the coder 104 and receiving the sequences $w_2$ and $v_3$, and supplies on the one hand an a posteriori estimation sequence $w_3$ and on the other hand an estimated sequence a', and
- a deinterleaver 307, the inverse of the interleaver 305, receiving the sequence $w_3$ and supplying the sequence $w_4$.

The estimated sequence a' is taken into account only following a predetermined member of iterations (see the article "*Near Shannon limit error-correcting coding and decoding: turbocodes*" cited above).

In accordance with the present invention, in initialising the decoders 304 and 306, account is taken of the fact that the coders 102 and 104 each have an initial state and a nil final state.

In FIG. 4, there can be seen successively, on rows ordered from top to bottom,
- the sequence u of symbols to be coded, of length n',
- the sequence a consisting of the sequence u and of so-called "padding" bits which guarantee the divisibility of the polynomial representation of the sequence a by the divisor polynomial g(x),
- the sequence a, identical to the sequence $v_1$, consisting of the sequence a and of so-called "stuffing" bits which give the sequence a' a length which is a multiple N0,
- the sequences $v_1$, $v_2$ and $v_3$, the last two of which result from the coding of the first.
- the sequences $v'_1$, $v'_2$ and $v_3$, ($v'_1$ being identical to the sequence a), and
- the radio frame which contains, as a payload, the sequences $v'_1$, $v'_2$ and $v_3$.

In FIG. 5, it can be seen that a first way of implementing the invention consists, in a coding and transmission device, are putting in non-volatile memory the positions where there are situated the symbols resulting from the permutation for each position in the permuted sequence, for each possible value of n.

Likewise, in FIG. 6, it can be seen that a first way of implementing the invention consists, in a reception and decoding device, of putting in non-volatile memory the positions where there are situated the symbols resulting from the permutation for each position in the permuted sequence, for each possible vale of n, and putting in non-volatile memory the positions where there are situated the symbols resulting from the inverse permutation for each position in the sequence, for each possible value of n.

In FIGS. 5 and 6, the only parameter describing the current interleaver and stored in volatile memory is the size of the interleaver.

However, in a preferential embodiment of the present invention, illustrated in FIGS. 7 and 8, it suffices to store in non-volatile memory:
- a table E of the parameter values of each interleaver and, for each possible value of n, in the coding and sending device, and
- a table E of the parameter values of each interleaver and possibly parameter values of each inverse interleaver, for each possible value of n, in the reception and decoding device.

In addition, it is necessary to store in volatile memory:
- a table E(n) of the interleaver parameter values, for the value of n under consideration, in the coding and sending device, and
- a table E(n) of the parameter values of the interleaver and possibly the parameter values of the inverse interleaver, for the value of n under consideration, in the reception and decoding device.

FIG. 9 illustrates schematically the constitution of a network station or computer coding station, in the form of a block diagram. The station has a keyboard 911, a screen 909, an external information source 910 and a radio transmitter 906, conjointly connected to an input/output port 903 of a processing card 901.

The processing card 901 has, connected together by an address and data bus 902:
- a central processing unit 900;
- a random access memory RAM 904;
- a non-volatile memory 905; and
- the input/output port 903.

Each of the elements illustrated in FIG. 9 is well known to persons skilled in the art of microcomputers and transmission systems and, more generally, information processing systems. These common elements are therefore not described here. It should be noted, however, that:
- the information source 910 is, for example, an interface peripheral, a sensor, a demodulator, an external memory or other information processing system (not shown), and is preferentially adapted to supply sequences of signals representing speech, service messages or multimedia data, in the form of binary data sequences,
- the radio transmitter 906 is adapted to implement a packet transmission protocol on a wireless channel, and to transmit these packets over such a channel.

It should also be noted that the word "register" used in the description designates, in each of the memories 904 and 905, both a memory area of low capacity (a few binary data) and a memory area of large capacity (enabling an entire program to be stored).

The random access memory 904 stores data, variables and intermediate processing results, in memory registers bearing, in the description, the same names as the data whose values they store. The random access memory 904 contains notably the registers illustrated in FIG. 7:
- a register "n" in which there is stored the calculated value of n, according to the length of the sequence data to be coded,
- a register "E(n)" in which there is stored the table of the interleaver parameter values, according to the calculated value of n, using the non-volatile memory 905,
- a register "interleaver" in which there is stored the table defining the interleaver, according to the value of n,
- registers "u", "a" and "a", in which there are respectively stored the sequence of data to be coded, u, and the sequences resulting from the padding operation, a, and then the stuffing operation, a',
- registers "$v_{1>>}$, $<<v_1'>>$, $>>v'_{2<<}$ and $<<v_3>>$ in which there are respectively stored the sequences a', a, and the sequences resulting from the turbocoding,
- a register "N 0" storing the value of N0, a register "M", storing the value of M, and a register "radio_frame" in which the entire radio frame to be transmitted is stored (see FIG. 4).

The non-volatile memory 905 is adapted to store, in registers which, for convenience, have the same names as the data which they store:

the operating program of the central processing unit 900, in a register "program", the sequence g, in a register "g", the sequence h, in a register "h", the table E of the interleaver parameter values, for each possible value of n.

The central processing unit 900 is adapted to implement the flow diagram described in FIG. 11.

FIG. 10 illustrates schematically the constitution of a network station or computer decoding station, in the form of a block diagram. This station has a keyboard 1011, a screen 1009, an external information destination 1010, and a radio receiver 1006, conjointly connected to an input/output port 1003 of a processing card 1001.

The processing card 1001 has, connected together by an address and data bus 1002:

a central processing unit 1000;

a random access memory RAM 1004;

a non-volatile memory 1005; and the input/output port 1003.

Each of the elements illustrated in FIG. 10 is well known to persons skilled in the art of microcomputers and transmission systems and, more generally, information processing systems. These common elements are therefore not described here. It should be noted, however, that:

the information destination 1010 is, for example, an interface peripheral, a display, a modulator, an external memory or other information processing system (not shown), and is preferentially adapted to receive sequences of signals representing speech, service messages or multimedia data, in the form of sequences of binary data, the radio receiver 1006 is adapted to implement a packet transmission protocol on a wireless channel, and to transmit these packets on such a channel.

It should also be noted that the word "register" used in the description designates, in each of the memories 1004 and 1005, both a memory area of low capacity (few binary data) and a memory area of large capacity (enabling an entire program to be stored).

The random access memory 1004 stores data, variables and intermediate processing results, in memory registers bearing, in the description, the same names as the data whose values they store. The random access memory 1004 contains notably the registers illustrated in FIG. 8:

a register "n" in which there is stored the calculated value of n, according to the length of the sequences of data to be coded, a register "E(n)" in which there is stored the table of the values of the parameters of each interleaver, and if applicable of each inverse interleaver, according to the value of n, using the non-volatile memory 1005, a register "interleaver" in which there is stored the table defining the interleaver and inverse interleaver, according to the value of E(n), the registers "$v'_{1>>}$, $<<v'_{2>>}$ and $<<v_3, >>$", in which the received sequences are respectively stored, registers "$w_1$", "$w_2$", "$w_3$" and "$w_4'$", in which the intermediate decoding sequences (see FIG. 3) are respectively stored, a register "a'", in which the decoded sequence is stored, a register "i", in which the value of an intermediate processing variable i is stored, a register "N0" storing the value of N0, a register "M", storing the value of M, and a register "radio_frame" in which the entire radio frame receiver is stored (see FIG. 4).

The non-volatile memory 1005 is adapted to store, in registers which, for convenience, have the same names as the data which they store:

the operating program of the central processing unit 1000, in a register "program", the sequence g, in the register "g", the sequence h, in the register "h", the table E of the parameter values of interleavers and if applicable inverse interleavers, for each possible value of n.

The central processing unit 1000 is adapted to implement the flow diagram described in FIG. 12.

In FIG. 11, it can be seen that, following an initialisation operation 1101 of a type known to persons skilled in the art of systems including a central unit, during an operation 1102, the central unit 900 waits for a sequence of symbols to be coded to be transmitted to it by the information source 910. It should be noted here that the end of this sequence is marked either by a fairly long delay before another symbol is transmitted, or by information having particular values which signify that the sequence is ended.

Next, during an operation 1103, the central unit 900 determines the number n' of symbols of the sequence which are to be transmitted, extracting the symbols which are not intended to be transmitted, in accordance with known procedures.

Then, during an operation 1104, the central unit performs a padding operation during which, at the end of the sequence of symbols to be transmitted, a number of binary symbols equal to the degree of the divisor polynomial g(x), is added so that the polynomial representation of this sequence is divisible by the polynomial g(x).

Then, in parallel:

a stuffing operation 1105 is performed, during which binary symbols of nil value are added at the end of the sequence resulting from the padding operation, so that the number n of binary symbols of the final sequence is a multiple of the number N0, which is, it will be recalled, the smallest value such that the polynomial $x^{N0}+1$ is divisible by the polynomial g(x);

an operation of generating an interleaver 1106 is performed in accordance with one of the procedures illustrated in FIG. 13 or, preferentially, 14, taking into account the table E(n) extracted from the table E which is associated, in the non-volatile memory 905, with the value of the length n.

Next, the sequence resulting from the stuffing operation 1105 is turbocoded during a turbocoding operation 1107 using the interleaver generated during the operation 1106, the divisor polynomial g(x) and the multiplier polynomial h(x).

Then, during an operation of removing stuffing bits 1108:

the stuffing bits are removed at the end of the sequence $v_1$ and the parity bits corresponding to these stuffing bits are removed at the end of the sequence $v_2$, in order to form, respectively, the sequences $v'_1$ and $v'_2$.

Finally, during an operation 1109, the sequences $v'_1$, $v'_2$ and $v_3$ are inserted into radio frames, they modulate electromagnetic signals and are transmitted over a radio channel.

Operation 1102 is then reiterated.

In FIG. 12, it can be seen that, following an initialisation operation 1201 of a type known to persons skilled in the art of systems having a central unit, during an operation 1202, the central unit 1000 waits until a radio frame is transmitted to it by the coding and transmission device. It should be noted here that the end of this radio frame is marked by information having particular values.

Next, during an operation 1203, the central unit 1000 determines the number 3n−2s of symbols of the radio frame which are to be coded, extracting the symbols which are not intended to be decoded, in accordance with known procedures.

During the same operation 1203, the central unit 1000 determines the value of n and that of s, considering that n is a multiple of 7 and that s<14.

Then, in parallel:

during an operation 1204, the central unit 1000 performs a "stuffing" operation on the first two sequences to be decoded, adding to them stuffing bits and the corresponding parity bits allocated the highest possible reliability value corresponding to a nil hard bit so that the length of the result in sequence is equal to n, and during an operation 1205, the central unit 1000 generates the interleaver and inverse interleaver, taking into account the table E(n) extracted from the table E, which is associated with the value n, in the non-volatile memory 1005.

Next, during an operation 1206, the three sequences originating, with regard to the first two, from the stuffing operation 1204 and, with regard to last one, from the operation 1203, are decoded using the interleavers generated during the operation 1205, the divisor polynomial g(x) and the multiplier polynomial h(x). This operation supplies an estimation of the sequence a'.

Then, during an operation 1207, the symbols added during the stuffing operation 1204 and those coming from a padding operation performed on coding (see operation 1104), and which are, with regard to the latter, equal in number to the degree of the divisor polynomial g(x), are removed from the sequence a' in order to form the transmitted sequence u. Finally, the transmitted sequence u is sent to the information destination 1210, and operation 1202 is reiterated.

FIG. 13 depicts an interleaver according to the present invention which keeps the property of divisibility by the feedback polynomial or polynomials of the constituent coders, whilst remaining simple to generate.

It is assumed that the period of the feedback polynomial or polynomials used is equal to N0. It should be noted that, with a generator polynomial $g(x)=1+x+x^3$, N0 is equal to 7.

During a first step, the data are written row by row in a table with N0 columns and M rows.

During a second step, after having defined N0 primary permutations of size M, which correspond respectively to the columns of the table, the data within each column are permuted in accordance with the primary permutation which corresponds to it.

During a third step, the columns are permuted together in accordance with a column permutation which preserves the divisibility by the feedback polynomial. This amounts to the property of transforming the cyclic code of length N0 and with a feedback generator polynomial g(x) into an equivalent cyclic code of the generator polynomial g(x) and that it acts by permutation on the N0 columns of the table.

The primary permutations of size M can be selected in different ways. Nevertheless, in order to limit the complexity of generating such interleavers, the number of parameters necessary for defining them can be limited.

A first embodiment consists of defining the first of these permutations and effecting a circular permutation on the following ones in iterative fashion: the $i^{th}$ permutation is obtained by circular permutation of a certain value, $S_i$, of the $(i-1)^{th}$ permutation. Thus the parameters necessary for defining these primary permutations are on the one hand the parameters necessary for defining the first primary permutation and the (N0−1) values $S_i$.

In this first embodiment, the first primary permutation can be one of the following types:

pseudo-random permutation (this type of permutation in general affords optimisation of the performance but requires to be stored completely in random access memory), algebraic permutation with one or more dimensions (which will be described below), permutation obtained by extraction from a permutation of larger size (which will be described below), permutation obtained by extraction from a permutation of larger size of algebraic type, permutation of size equal to a power of 2 consisting of performing a simple operation on the bits constituting the binary notation of the ranks of the interleaver elements. This simple operation can for example be of the bit inversion type or circular permutation on these bits. This permutation can be combined with each of the previously mentioned permutations.

In this first embodiment, the choice of the values $S_i$ is preferentially balanced, that is to say they are close to each other and such that their sum modulo M is close to (M−N0) without the values of $S_i$ themselves being close to zero. For example, with N0=7 and if M=47, it is possible to choose $S_1=7, S_2=7, S_3=7, S_4=7, S_5=7, S_6=6$.

If, in addition, M is a multiple of N0, all the values of Si are preferentially equal, without these being close to zero. For example, with N0=7 if M=49, it is possible to choose $S_i=21$.

A second embodiment consists of defining the N0 primary permutations independently of each other. In order to keep low complexity overall, each of these permutations must itself be of low complexity, which here excludes the pseudo-random permutations.

In this second embodiment, each primary permutation can be one of the following types:

algebraic permutation with one or more dimensions (which will be described below), permutation obtained by extraction from a permutation of larger size (which will be described below), permutation obtained by extraction from a permutation of larger size of algebraic type, permutation of size equal to a power of 2 consisting of performing a simple operation on the bits constituting the binary notation of the ranks of the interleaver elements. This simple operation can for example be of the bit inversion type or circular permutation on these bits. This permutation can be combined with each of the previously mentioned permutations.

With regard to the permutation acting on the columns, it can be circular on the column, or, as a variant, the columns being numbered in increasing binary numbers, it can be circular on the bits of the column numbers.

The permutation which transforms p1 into p2, p2 into p3, p3 into p1, q1 into q2, q2 into q1 and which leaves the other elements invariant is denoted (p1 p2 p3) (q1 q2).

With this notation, the permutations having the property of transforming the cyclic code of length N0 and with a generator polynomial g(x) into an equivalent cyclic code with a generator polynomial g(x) are the 168 permutations of the group of permutations generated by:

(0 1 2 3 4 5 6) (circular permutation)

(1 2 4) (3 5 6) . . .

(2 4) (5 6)

(2 5) (4 6)

(2 6) (4 5)

It should be noted that the permutation (1 2 4)(3 6 5) can easily be effected by an electronic logic circuit since it is a case simply of effecting a circular permutation on the bits of the binary notation of the elements to be permuted.

It will be noted, in FIG. 14, that, in order to generate an interleaver or permutation of the algebraic type with one dimension, the central unit 900, or respectively 901, for coding, or respectively decoding, first of all performs an initialisation operation 1401, during which it sets to zero all the values of the register "interleaver" and an intermediate variable i, and takes into account the value of M, the size of the interleaver to be generated and the value of a parameter e, prime with M.

Next, during an operation 1402, the value of the i-$^{th}$ data item stored in the interleaver is calculated as being equal to the value of i multiplied by e, modulo M. Next, during an operation 1403, the central unit 900 increments the value of the variable i by 1. Then, during a test 1404, the central unit 900 determines whether or not the value of the variable i is equal to M−1.

When the result of test 1404 is negative, operation 1402 is reiterated. When the result of test 1404 is positive, the interleaver generation operation 1406 is ended.

FIG. 15 shows a preferred embodiment implemented by the central unit 900, or respectively 901, for coding, or respectively decoding, in order to generate the one-dimension algebraic interleaver, reducing the complexity of the calculations made and therefore the calculation necessary for implementing the present invention.

The operations illustrated in FIG. 15 are identical to those which are illustrated in FIG. 14, with the exception of operation 1402, which is replaced by an operation 1502 during which the content of the (i+1)-th position of the interleaver is calculated and is equal to the content of the i-$^{th}$ position to which e is added, the operation being performed modulo M.

It will be understood that a simple addition here replaces a multiplication, which simplifies this operation 1502 and can considerably reduce its duration, compared with operation 1402.

It can be seen, in FIG. 16, that, in order to generate an interleaver or permutation of the algebraic type with two dimensions of size M, the central unit 900, or respectively 901, for coding, or respectively decoding, first of all performs an initialisation operation, during which its sets to zero all the values of the register "interleaver" and takes into account the value of M, the size of the interleaver to be generated and the value of the parameters $N_1$ and $N_2$ such that the product of $N_1$ and $N_2$ is equal to M, and parameters $\alpha_1$, prime with $N_1$, $\beta_1$, $\alpha_2$, prime with $N_2$, and $\beta_2$.

During an operation 1601, the data to be permuted are written row by row in a table with $N_1$ rows and $N_2$ columns.

During a following operation 1602, the rows are permuted algebraically, namely for each row having a rank row#i between 0 and $N_1-1$, this row is moved to the rank Perm (row#i) equal to (row#i*$\alpha_1+\beta_1$) modulo $N_1$.

Next, during an operation 1603, the columns are permuted algebraically, namely for each row having a rank column#i between 0 and $N_2-1$, this row is moved to the rank Perm (column#i) equal to (column#i*$\alpha_2+\beta_2$) modulo $N_2$.

It can be seen, in FIG. 17, that, in order to generate an interleaver of size M by extraction from a parent interleaver of larger size, the interleaving values greater than or equal to M are eliminated from the latter.

For example, if M is equal to 5 and if the large-size interleaver is defined by the permutation (4, 5, 0, 3, 2, 6, 7, 1), the extracted interleaver will be defined by the permutation (4,0,3,2,1).

It can be considered preferentially that the parent interleavers will have a size which is a power of 2.

It should be noted that, according to the applications concerned, it will be necessary to define a more or less large number of sizes of interleaver, a service quality will be required expressed as a more or less severe bit or frame error rate and a more or less economical design will be required in the form of an electronic circuit which can notably be in cabled, ASIC or signal processor form. An important advantage of the interleavers disclosed above is their great flexibility. Thus in all cases it will be possible to find the best performance/complexity compromise, sometimes by mixing the advantages of several types of primary permutation.

Thus, for example, if a primary interleaver of size 64 is defined algebraically with two dimensions, and if the first way of proceeding disclosed above is opted for, the number of parameters will be stored is very small:

There may be, for example

E(329)={$S_1$=7, $S_2$=7, $S_3$=7, $S_4$=7, $S_5$=7, $S_6$=6, $N_1$=8, $N_2$=8, $\alpha_1$, $\beta_1\alpha_2$, $N_2$, $\beta_2$}

E(343)={$S_1$=7, $S_2$=7, $S_3$=7, $S_4$=7, $S_5$=7, $S_6$=7, $N_1$=8, $N_2$=8, $\alpha_1$, $\beta_1$, $\alpha_2$, $N_2$, $\beta_2$}

That is to say, in read only memory in compact fashion:

E={$N_1$=8, $N_2$=8, $\alpha_1$, $\beta_1$, $\alpha_2$, $\beta_2$} (for the parent interleaver of size 64 making it possible to generate the first primary permutations of size 47 and 49)

$\cup${$S_i$=7, $S_2$=7, $S_3$=7, $S_4$=7, $S_5$=7, $S_6$=6}$_{M=47}$ $\cup${$S_i$=7, $S_2$=7, $S_3$=7, $S_4$=7, $S_5$=7, $S_6$=7}$_{M=49}$ The values of $\alpha_1$, $\beta_1$, $\alpha_2$, $\beta_2$ can be optimised by simulations. The large number of possible values facilitates this optimisation.

Naturally, the present invention is in no way limited to the embodiments described and depicted, but on the contrary encompasses any variant within the capability of persons skilled in the art.

What is claimed is:

1. Method of interleaving binary symbols representing a physical quantity, used in a coding system with at least two recursive convolutional coders each having a divisor polynomial which all share the same given period or used in a decoding system corresponding to the coding system, comprising:

writing binary symbols in a table having a first number (N0) representing the number of columns, equal to the period of the coders, and a second number (M) representing the number of rows, first permutations of the symbols on each of the columns, and second permutation of the columns with each other, said second permutation preserving the property of return to zero of the coders.

2. Interleaving method according to claim 1, wherein the first permutations are derived from each other, passing from one column to the next, by shifting modulo the second number (M), representing the number of rows of the table.

3. Interleaving method according to claim 1, wherein the first permutations are derived from each other, passing from one column to the next, by a shifting which is substantially the same for all the columns.

4. Interleaving method according to claim 1, wherein the first permutations are derived from each other, passing from one column to the next, by a shifting which is the same for all the columns, when the second number (M), representing the number of rows of the table, is a multiple of the first number (N0), representing the number of columns of the table.

5. Interleaving method according to claim 1, wherein the first permutations are identical to each other.

6. Interleaving method according to any one of claims 1 to 5, wherein the first permutations are of the algebraic type, with at least one dimension.

7. Interleaving method according to any one of claims 1 to 5, wherein the first permutations are obtained by extraction effected on an interleaver of larger size.

8. Interleaving method according to claim 7, wherein the largest size is a power of two.

9. Interleaving method according to any one of claims 1 to 5, wherein the first permutations are psuedo-random.

10. Interleaving method according to any one of claims 1 to 5, wherein the second permutation is circular.

11. Interleaving method according to any one of claims 1 to 5, wherein the columns being numbered by increasing binary numbers, the second permutation is circular on the bits of the column numbers.

12. Method of turbocoding binary symbols representing a physical quantity, including the interleaving method according to any one of claims 1 to 5.

13. Method of turbodecoding binary symbols representing a physical quantity, including the interleaving method according to any one of claims 1 to 5.

14. Device for interleaving binary symbols representing a physical quantity, used in a coding system with at least two recursive convolutional coders each having a divisor polynomial which all share the same data period or are in a corresponding decoding system, comprising:

means for writing binary symbols in a table having a first number (N0), representing the number of columns, equal to the period of the coders, and a second number (M) representing the number of rows, first means for permuting the symbols on each of the columns, and second means for permuting the columns with each other, said second permutation preserving the property of return to zero of the coders.

15. Interleaving device according to claim 14, wherein said first means is adapted to implement first permutations which are derived from each other, passing from one column to the next, by shifting modulo the second number (M), representing the number of rows of the table.

16. Interleaving device according to claim 14, wherein said first means is adapted to implement first permutations which are derived from each other passing from one column to the next by a shifting which is substantially the same for all the columns.

17. Interleaving device according to claim 14, wherein said first means is adapted to implement first permutations which are derived from each other passing from one column to the next by a shift which is the same for all the columns, when the second number (M), representing the number of rows of the table, is a multiple of the first number, representing the number of columns of the table.

18. Interleaving device according to claim 14, wherein said first means is adapted to implement first permutations which are identical to each other.

19. Interleaving device according to any one of claims 14 to 18, wherein said first means is adapted to implement first permutations which are of an algebraic type, with at least one dimension.

20. Interleaving device according to any one of claims 14 to 18, wherein said first means is adapted to implement first permutations which are obtained by extractions performed on an interleaver of larger size.

21. Interleaving device according to claim 20, wherein an extraction is effected on an interleaver whose size is a power of two.

22. Interleaving device according to any one of claim 14 to 18, wherein said first means is adapted to implement first permutations which are pseudo-random.

23. Interleaving device according to any one of claims 14 to 18, wherein said second means is adapted to number the columns by increasing binary numbers, and to implement a second permutation which is circular.

24. Interleaving device according to any one of claims 14 to 18, wherein said second means is adapted to number the columns by increasing binary numbers, and to implement a second permutation which is circular on the bits of the column numbers.

25. Device for turbocoding binary symbols representing physical quantity, including the interleaving device according to any one of claims 14 to 18.

26. Device for processing signals representing speech, including a coding device according to claim 25.

27. Data transmission device having a transmitter adapted to implement a packet transmission protocol, including a coding device according to claim 25.

28. Data Transmission device according to claim 27, wherein said protocol is the ATM (asynchronous transfer mode) protocol.

29. Data transmission device according to claim 27, wherein said protocol is the ETHERNET type protocol.

30. Data transmission device having a transmitter transmitting over a wireless channel, including a coding device according to claim 25.

31. Device for processing sequences of signals representing at most one thousand binary data, including a coding device according to claim 25.

32. Network station, including a coding device according to claim 25.

33. Device for turbodecoding binary symbols representing physical quantity, including the interleaving device according to any one of claim 14 to 18.

34. A method of coding binary symbols representing a physical quantity, comprising operations of:

writing binary symbols in a table having a first number of columns in accordance with a period of a coder and a second number of rows;

first permutations for permuting the symbols on each of the columns;

second permutation for permuting the columns with each other, said second permutation preserving a property of return to zero of the coder; and coding output of the second permutation step.

35. A method of decoding binary symbols representing a physical quantity, comprising operations of:

writing binary symbols in a table having a first number of columns in accordance with a period of a coder and a second number of rows;

first permutations for permuting the symbols on each of the columns;

second permutation for permuting the columns with each other, said second permutation preserving a property of return to zero of the coder, and decoding output of the second permutation step.

36. A method according to any one of claims 34 to 35, wherein the first permutations are of algebraic type, with at least one dimension.

37. A method according to any one of claims 34 to 35, wherein the first permutations are obtained by extraction effected on an interleaver of larger size.

38. A method according to any one of claims 34 to 35, wherein the second permutation is circular.

39. A device for coding binary symbols representing a physical quantity, comprising:

means for writing binary symbols in a table having a first number of columns in accordance with a period of a coder and a second number of rows;

first permutation means for permuting the symbols on each of the columns;

second permutation means for permuting the columns with each other, said second permutation means preserving a property of return to zero of the coder; and means for coding output of the second permutation means.

40. A device for decoding binary symbols representing a physical quantity, comprising:

means for writing binary symbols in a table having a first number of columns in accordance with a period of a coder and a second number of rows;

first permutation means for permuting the symbols on each of the columns;

second permutation means for permuting the columns with each other, said second permutation means preserving a property of return to zero of the coder; and means for decoding output of the second permutation means.

41. A device according to any one of claims 39 to 40, wherein said first permutation means is adapted to implement first permutations which are of an algebraic type, with at least one dimension.

42. A device according to any one of claims 39 to 40, wherein said first permutation means is adapted to implement first permutations which are obtained by extractions performed on an interleaver of larger size.

43. A device according to any one of claims 39 to 40, wherein said second permutation means is adapted to implement a second permutation which is circular.

\* \* \* \* \*

UNITED STATES PATENT AND TRADEMARK OFFICE
CERTIFICATE OF CORRECTION

PATENT NO. : 6,625,762 B1
DATED : September 23, 2003
INVENTOR(S) : Claude Le Dantec It is certified that error appears in the above-identified patent and that said Letters Patent is hereby corrected as shown below:

Column 4,
Line 6, "NO" should read -- N0 --.

Column 8,
Line 59, "us" should read -- $u_i$ --.

Column 12,
Line 63, ""$v_1$>>, <<$v_1'$>>, >>$v'_2$<< and <<$v_3$ >>" should read -- "$v_1$", "$v'_1$", "$v'_2$" and "$v_3$" --; and
Line 66, "N O" should read -- N0 --.

Column 13,
Lline 62, "$v'_1$>>, <<$v'_2$>> and <<$v_3$, >>" should read -- "$v'_1$", "$v'_2$" and "$v_3$" --.

Column 20,
Lines 12 and 47, "claim" should read -- claims --.

Signed and Sealed this

Sixth Day of September, 2005

JON W. DUDAS
*Director of the United States Patent and Trademark Office*